United States Patent [19]
Senglat et al.

[11] Patent Number: 6,034,531
[45] Date of Patent: Mar. 7, 2000

[54] MONITORING OF THE WEAR OF SLIDING ELECTRICAL CONTACTS AND ITS APPLICATION TO THE STATE-DEPENDENT AND/OR PREDICTIVE MAINTENANCE OF A DEVICE HAVING SLIDING ELECTRICAL CONTACTS

[75] Inventors: Jean-Paul Senglat, Vitrolles; Daniel De Frutos, Aix-En-Provence, both of France

[73] Assignee: Eurocopter, Marignane Cedex, France

[21] Appl. No.: 08/892,106

[22] Filed: Jul. 14, 1997

[30] Foreign Application Priority Data

Jul. 17, 1996 [FR] France .................................. 96 08944

[51] Int. Cl.$^7$ .................................................. G01R 27/08
[52] U.S. Cl. ............................ 324/699; 324/71.1; 73/104
[58] Field of Search .................................. 324/699, 71.1, 324/451, 454; 73/104, 7

[56] References Cited

U.S. PATENT DOCUMENTS 3,808,593  4/1974  Kopernik et al. ...................... 340/454
4,694,686  9/1987  Fildes et al. ........................ 324/71.1 X

FOREIGN PATENT DOCUMENTS

20 55 477  10/1970  Germany.

*Primary Examiner*—Josie Ballato
*Assistant Examiner*—T. R. Sundaram
*Attorney, Agent, or Firm*—Henderson & Sturm LLP

[57] ABSTRACT

The method of monitoring the wear of at least one sliding electrical contact of a brush, sliding over a track which can move with respect to the brush, comprises the measurement of the electrical resistance of this contact, the delivery of an image signal corresponding to this resistance, the following of its variations, the construction of a reference signal indicative of a state of wear of the contact, the comparison of the image signal with the reference signal and the derivation of a signal, resulting from this comparison, corresponding to the state of wear of the contact. The resistance is measured by the ratio of the variations in the voltage across the terminals of the contact to the variations in the current flowing through this contact.

10 Claims, 12 Drawing Sheets

MONITORING OF THE WEAR OF SLIDING ELECTRICAL CONTACTS AND ITS APPLICATION TO THE STATE-DEPENDENT AND/OR PREDICTIVE MAINTENANCE OF A DEVICE HAVING SLIDING ELECTRICAL CONTACTS

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

1. Field of the Invention

The present invention relates to a method of and to a device for monitoring the wear of at least one sliding electrical contact of at least one electrically conducting brush, sliding over at least one electrically conducting track which can move with respect to the brush, or vice versa, in a relative rotational or linear motion.

The invention also relates to the use of the method of monitoring the wear of a sliding electrical contact to the state-dependent and/or predictive maintenance of a device which includes at least one such contact between at least two electrically conducting elements, one being able to move with respect to the other.

2. Description of the Prior Art

It is known that many electrical devices and machines generally include several sliding electrical contacts, of the general type mentioned hereinabove, each consisting of the interaction of a brush, of the carbon type or of the type having a wiper wire or wires, which is fixed to a brush-holder support, with a track which is fixed to a track-carrying support and has an electrically conducting coating, for example made of gold or silver, over which the brush slides at a defined speed and in a defined direction of relative movement of the brush over the track because of the fact that the two supports are such that one can move with respect to the other.

Thus, in particular, there are many rotating electrical machines, such as electric motors, alternators, generators, rotating convertors and rotating commutators, in which the sliding electrical contacts are rotary contacts and the electrically conducting tracks are made in the form of rings, the number of rings and the number of brushes being chosen depending on the electrical power or on the number of control or measurement signals to be transferred between the two, brush-holder and ring-holder, supports, one of which, called the rotor, is mounted so as to rotate, generally by means of rolling bearings, over the other, called the stator.

It is known that with regard to the two electrically conducting elements, namely a brush and a ring, one being able to move relative to the other, which together form a sliding electrical contact, it does not matter whether the brush is on the rotor and the ring is on the stator, or the other way round.

Electrical devices and machines also exist which are equipped with sliding electrical contacts for which the brushes and the tracks are in relative linear translational motion with translational speeds, excursions and frequencies, In particular in linear commutators, which may be constant or may vary depending on the applications of such linear commutators.

Likewise, in rotating electrical machines, in particular rotary commutators, the speed and/or direction of rotation may be constant or may vary.

It is also known that the electrical devices and machines having sliding contacts, such as those mentioned hereinabove, equip many stationary or movable installations, motors, landborne, seaborne or airborne vehicles, and in particular aeroplanes and helicopters, on which these devices and machines are currently subjected to preventive or programmed maintenance which, for safety reasons, is particularly rigorous, restricting and expensive.

By way of example, current helicopters equipped with electrical systems for the de-icing or anti-icing, using Joule-effect heating, of the blades of their rotors are equipped with rotating electrical commutators both on the main rotor and on the tail rotor. The main function of such a rotating commutator is to send one or more electrical signals between the on-board electrical mains, on a fixed part, namely the structure of the helicopter, via the stator of the commutator, to a rotating part, namely the blades, via the rotor of the commutator. These electrical signals comprise power signals, for the electrical supply of the heating system resistance elements of the de-icing or anti-icing systems, and may comprise signals for controlling actuators, regulators and other electrical components mounted on the blades.

An additional function of such a rotating commutator may be to send one or more electrical measurement signals between the rotating part, namely the blades, via the rotor of the commutator to the fixed part, namely the structure of the helicopter, via the stator of this commutator.

Because of the friction between the fixed and moving conducting elements forming each sliding contact, these commutators suffer wear and are consequently subjected to periodic maintenance checks and actions, the periods of which vary depending in particular on the current output and on the linear or tangential speed of the linear or rotary contact and on the technology employed to produce the conducting coating of the tracks or rings and to provide the interaction between the latter and the brushes, so as to allow the current to flow in an optimum manner.

Typically, programmed maintenance of such rotating commutators may comprise a check, using a maintenance unit which includes the necessary measurement means, of the electrical continuity of the sliding contacts after a prescribed number of hours in service, for example every 1600 hours, in the case of the commutator of the main or tail rotor, in addition to removing any dust from the rings and brushes of the rotating commutator in the case of the tail rotor (because its speed of rotation is greater than that of the main rotor) after another prescribed number of hours in service has elapsed, for example every 400 hours in operation.

This results in high running and maintenance costs, because the helicopters are grounded for periodic inspections of the commutators, because of instances of unjustified removal of the commutators in order to check them, after a report on their good working order, which burdens the management of the stocks, and because of the considerable amount of equipment and human resources necessary, which result in a high number of maintenance hours for each flying hour of the helicopter.

BRIEF SUMMARY OF THE INVENTION

The problem forming the basis of the invention is to provide a method of and a device for monitoring the wear of sliding electrical contacts, in particular of such commutators, in order to reduce the running and maintenance costs by optimizing the operational and logistic aspects, by eliminating the periodic inspections and unjustified removal after a report on the good working order of the sliding contacts, and by only replacing any defective element advisedly, while at the same time reducing the equipment and human resources necessary for maintenance, by a reduction in particular in the number of maintenance hours per flying hour, and by thus doubly improving the up-time of helicopters without compromising their safety, or even helping to improve it.

One object of the invention is therefore to obviate programmed preventive maintenance, currently practised, in order to adopt unprogrammed maintenance, by the optimum use of techniques for integrated testing and automated monitoring, on a helicopter and, more generally, on any aircraft, vehicle or installation equipped with an electrical machine having a sliding contact, and/or predictive maintenance, which leads the user, whenever necessary, to anticipate the breakdown before it occurs, by the detection and treatment of signs heralding the fault.

After analysis, the main faults in electrical machines having sliding contacts, such as commutators, are:

- a loss of insulation, often associated with penetration of a fluid (water, oil or fuel), due to the lack of sealing or to the wear of the seals between components in relative motion, such as the stator and the rotor,
- the break in the electrical circuit, which may be detected, if this is a break not associated with wear, by checking the voltage and/or current on a static part, assuming that this break means that there is zero current and therefore zero voltage,
- a fault in the rolling bearings by means of which the rotor is mounted so as to rotate with respect to the stator, the wear of or specific defect in these rolling bearings possibly causing them to overheat, thus reducing the lubrication, which accentuates the degradation phenomenon, or an abnormal vibration, usually detected by the standard techniques of analysing accelerometric signals: in the case of a rotary commutator for a helicopter rotor, this commutator is only very slightly subjected to axial and radial loads, because of its functions, so that its internal vibration phenomena are barely detectable and are much less than the surrounding level of vibration and so that the associated processing techniques may not easily discriminate between the vibratory symptoms which are intrinsic to the commutator and those which are external to it,
- the wear of the sliding contacts, which depends on the speed of relative movement of the two parts forming each contact, on the currents flowing through them, on the number of brushes in contact with the same track and on the technology adopted for the conductive coating on the tracks and on the geometry of the elements forming the sliding contact: in the case of a silver technology, in which each brush of parallelepipedal general shape slides, flat, via a lateral face over a plane track or a cylindrical ring with a silver coating, it is known that the brush wears out before the track or ring, while in the case of a gold technology, in which each brush in the form of a cylindrical wire bears elastically in a V groove having walls made in the track or ring and coated with gold, the conductive coating on the track or ring wears out before the brush, degradation of the contact being very sudden at the end of life.

The idea forming the basis of the invention is to use the wear of the sliding contacts as a particularly useful parameter reflecting the state of the electrical machine, since this parameter constitutes a unique symptom representing the synthesis of the main causes of failure, which are not only the degradation due to friction between the fixed and moving parts of the electrical contact but also the break in the electrical circuit and the mechanical defects, such as wear in the rolling bearings and misalignments between the fixed and moving parts, as mentioned above.

Furthermore, over time, it appears that the wear of the sliding contacts is the first observable symptom.

In order to appreciate the extent of this wear before it has serious consequences, the principle forming the basis of the method of the invention consists in taking an instantaneous measurement of the resistance of the electrical contact between the two components, one of which is fixed and the other is moving, rotationally or linearly, this measurement giving rise to variations, called "electrical noise", the level of which varies, as already mentioned, depending on the technology employed for the conductive coating on the track and the geometry of the brush and of the track, the relative speed at which the brush slides over the track, the current output and the nature of the current, DC or AC, and in the latter case its frequency, and the number of contacting brushes on the same track.

For this purpose, the method according to the invention for monitoring the wear of at least one sliding electrical contact of the aforementioned type, is characterized in that it comprises the steps consisting in measuring the electrical resistance of said sliding contact, in delivering at least one image signal corresponding to the measured resistance, in tracking the variations in said image signal, in constructing at least one reference signal indicative of a state of wear of said sliding contact, in comparing said image signal with said reference signal and in deriving at least one signal corresponding to the state of wear of said sliding contact from said comparison of said image signal with said reference signal.

Advantageously, the step of measuring the electrical resistance of the sliding contact comprises the measurement of the variations in the electric current flowing through said sliding contact, the measurement of the variations in the voltage across the terminals of said sliding contact and the determination of the electrical resistance using the calculation of the ratio of the voltage to the current. Thus, all the usual acquisition, processing and reproduction techniques, whether analogue or digital, can be used for carrying out this measurement.

Since the value of this resistance increases significantly with the cumulative time of operation of a sliding electrical contact, and since the curve expressing this resistance as a function of time, over the lifetime of the electrical contact, exhibits quite a pronounced break depending on whether the electrical signal transferred by this contact is of the power signal type or of the small control or measurement signal type, it may be understood that a judicious choice of a threshold resistance or of its variation over time, or of permissible "electrical noise", can be used to predict the sudden failure of the sliding contact.

The various steps in the method may be implemented periodically, but in this case at a frequency such that the rapid end-of-life degradation of the sliding contact does not run the risk of escaping being monitored. For this reason, and in applications where safety is paramount, it is advantageous that the method consists in continuously carrying out the steps consisting in measuring the electrical resistance of said sliding contact, in delivering said image signal, in tracking its variations and in comparing it with said reference signal.

As mentioned above, the comparison step may comprise at least one comparison of the absolute value of said image signal with at least one reference signal, constructed in the form of a resistance threshold, indicative of a state of wear of said contact. However, this comparison step may also comprise at least one comparison of the variations, over time, in the value of the image signal with at least one reference signal, constructed in the form of a resistance slope threshold, indicative of the change in the wear of said contact. Of course, the comparison step may be a double comparison and comprise at least one comparison of the absolute value of the image signal with at least one resistance threshold and at least one comparison of the variations in the value of the image signal with at least one resistance slope threshold, if both state-dependent and predictive maintenance is desired.

In order to refine the process of tracking the change in the wear of a sliding contact in service, it is also possible for the comparison step to comprise at least one comparison of said image signal with at least one reference signal which will have been subjected to conventional signal-processing techniques, for example a reference signal constructed, by a learning process, in the form of a recording of prior image signals which are duly processed, in particular filtered and averaged.

For the implementation of the method given above, the invention also proposes a device for monitoring the wear of at least one sliding electrical contact, which is characterized in that it comprises:

means for measuring the current flowing through said sliding contact, means for measuring the voltage across the terminals of said sliding contact, means for calculating the electrical resistance of said sliding contact and for constructing an image signal corresponding to said resistance, means for constructing at least one reference signal indicative of a state of wear of said sliding contact, means for comparing said image signal with said reference signal, and means for generating a signal corresponding to the state of wear of said sliding contact.

The invention also relates to the application of the method as defined above to the state-dependent and/or predictive maintenance of a device which includes at least one sliding electrical contact between at least two elements moving with respect to each other, such as a commutator, characterized in that it consists in delivering at least one signal corresponding to the state of wear of said contact and/or anticipating when said contact will break, upon said image signal, corresponding to its electrical resistance, crossing at least one threshold indicative of the wear of said contact. In this application, the method of monitoring the wear of at least one sliding electrical contact may be implemented on a dedicated contact mounted in an electrical channel dedicated to said monitoring, and/or on a contact mounted in an electrical power channel, or in a channel for controlling or measuring in said device which includes said contact.

The invention thus proposes a method of monitoring the wear of a sliding electrical contact which may be implemented whatever the type of brush, carbon or wire type, the number of brushes and the number of tracks, the electrical power to be transferred, the material used in the manufacture of either part of the contact, whether the contact is a linear or rotary contact, and for any type of electrical machine, in particular a rotating machine, comprising at least one sliding electrical contact between two components in relative motion, one of which is fixed and the other in rotational or linear motion.

Likewise, the method of the invention may be implemented whatever the relative speed of the brush and the track, the direction of rotation in the case of a rotating machine, the excursion and frequency of linear motion, in the case of a linear commutator, and the use of the brush as a fixed or moving part of the electrical contact.

BRIEF DESCRIPTION OF THE SEVERAL VIEWS OF THE DRAWINGS

Other characteristics and advantages of the invention will emerge from the description given below, in a non-limiting manner, of embodiments described with reference to the appended drawings in which:

FIG. 6 represents two "electrical noise" curves as a function of time, one in the case of power signals and the other in the case of control signals, FIGS. 10a to 18b represent various recordings of the "electrical noise" for different conductive coating technologies, various speeds of movement of the contact and for different numbers of brushes in contact with the same ring.

DETAILED DESCRIPTION OF THE INVENTION

The method and the device of the invention are described with reference to a particular application consisting in monitoring the wear of the sliding electrical contacts of a rotary commutator in an installation for electrically de-icing the blades of a helicopter rotor, as shown in FIGS. 1 to 3a, in order to carry out state-dependent and/or predictive maintenance on these rotating commutators.

Figure 1:
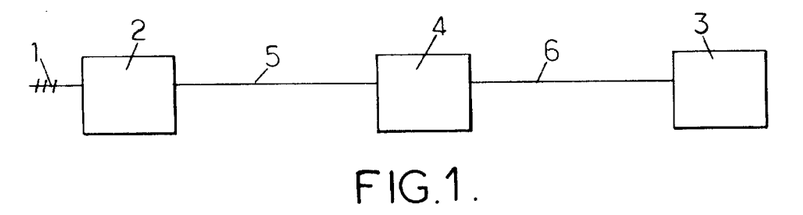
FIG. 1 represents diagrammatically a system for de-icing helicopter blades having a heating mat supplied via a rotating commutator.

In FIG. 1, 1 denotes an electrical line from the helicopter mains consisting of a three-phase current at a voltage of 115 V and a frequency of 400 Hz, for supplying a power unit 2 which is fitted onto the structure of the helicopter. Heating mats 3, each fitted onto a blade of a rotor of the helicopter, are supplied by this power unit 2 with 270 V DC via a rotating commutator 4, of any suitable conventional structure, comprising a stator connected to the unit 2 via a cable 5 having at least two conductors, and also comprising a rotor which is mounted so as to rotate around the stator by means of rolling bearings and is connected to the heating mats 3 via electrical cables having at least two conductors 6. In the commutator 4, the transfer of current between the stator and the rotor, in order for the unit 2 to supply a mat 3, as well as between the rotor and the stator, for the electrical return, takes place in each direction by a sliding electrical contact between at least one brush, carried by the stator or the rotor, and at least one ring carried respectively by the rotor or the stator.

On the main rotor (FIG. 2), each heating mat 3 is supplied cyclically, by applying voltage pulses of approximately constant amplitude but of variable duty cycle, that is to say that the duration of successive pulses can vary, two successive pulses being separated by a time interval with no power.

In the commutator 4 of the main rotor (FIG. 2), as in that of the tail rotor (FIG. 3), the sliding electrical contacts are shown diagrammatically at 7 and each corresponds to the interaction of at least one brush sliding over at least one conducting ring. In the case of the commutator 4 of the main rotor (FIG. 2), a set of sliding contacts 7 is provided in the channel for supplying electrical power to the heating mat 3 of each blade, while the sliding contacts 7 in the return channel, from the heating mats 3 to the power unit 2, are common to all the heating mats 3 and a virtually constant current therefore passes through them.

In contrast, in the commutator 4 of the tail rotor (FIG. 3), the heating mats 3 are supplied continuously, but their power supply varies depending on the external temperature conditions. For example, for an external temperature of −30° C., the power may be 9 kW, the DC supplied being 3.3 A at a voltage of 270 V, while for an external temperature of 0° C., the power may be reduced to 0.2 kW, the DC supplied being 1.3 A at a voltage of 150 V.

Figure 2:
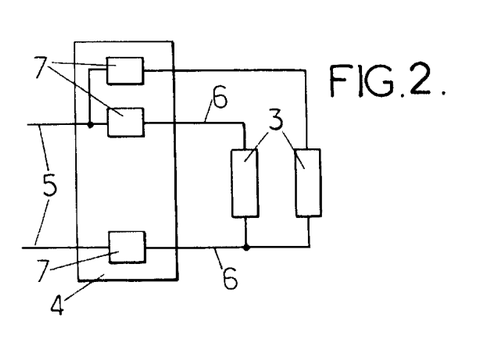
FIGS. 2, 3 and 3a represent diagrammatically the electrical arrangement of the sliding contacts of the commutator and of the heating mats of the system in FIG. 1, respectively in the case of a main rotor, in the case of a tail rotor and in the case of a rotor on which a measurement signal comes from a blade equipped with a heating mat.
Figure 3:
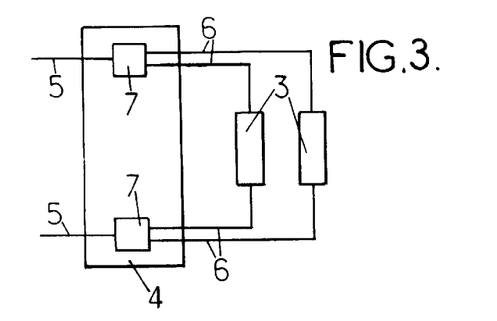
Figure 3A:
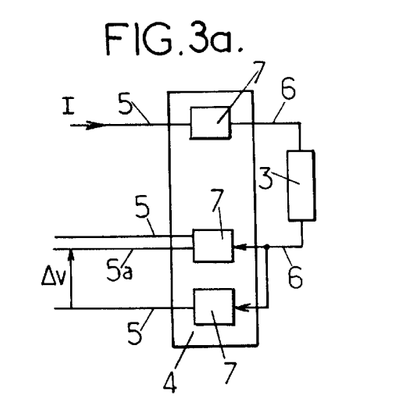

The sets of sliding contacts 7 in FIGS. 2 and 3 may, for example, be produced using gold technology (FIG. 4) or silver technology (FIG. 7), or any other technology, assuming that, in all cases, each set of sliding contacts 7 consists of a set, fixed to the stator, comprising two brushes sliding over the same conducting ring fixed to the rotor of the commutator 4.

Figure 4:
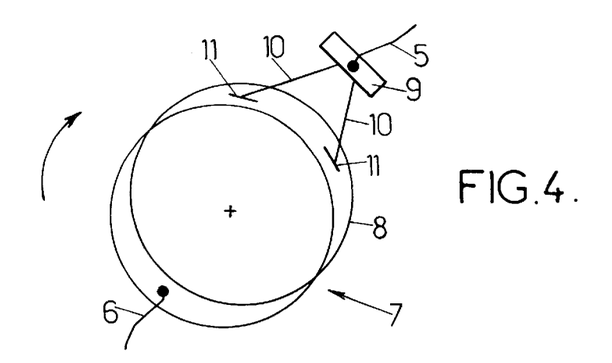
FIG. 4 represents diagrammatically a gold-technology ring-brush assembly which can be used to produce the sliding contacts in FIGS. 2, 3 and 3a, FIG. 5 represents a diagram showing the principle of the measurement of the "electrical noise" of a ring-brush assembly according to FIG. 4.

In FIG. 4, the set 7 of sliding contacts comprises a ring 8 rotating with the rotor, coated with an external gold coating and connected by soldering to one of the electrical input or output leads of the conductor 6, while one of the respective electrical input or output leads of the conductor 5 is soldered to the brush holder 9, fixed to the stator and supporting two brushes 10 of the conducting wire type, each of which consists of a fine electrically conducting cylindrical rod, bearing elastically, due to its intrinsic flexibility, against the conductive coating of the ring 8, and more specifically against the walls of a V groove made in the outer face of this ring 8. Each wire-brush 10 thus forms an electrical contact 11 sliding over the ring 8.

In silver technology (FIG. 7), again there is a rotary ring 8', which is cylindrical with a silver conductive coating on its outer face over which slide, flat, two brushes 10', each consisting of a carbon block of substantially parallelepipedal shape at the end of respectively one of the two V-inclined metal strips supported by a brush holder 9' and pressing the brushes 10' elastically against the ring 8' in order to form two sliding electrical contacts 11'.

Figure 7:
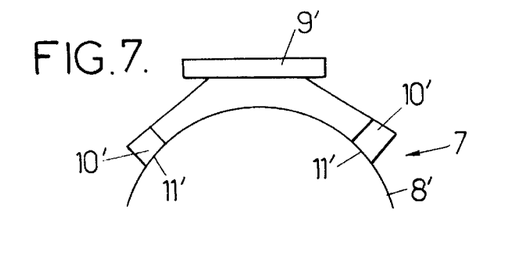
FIG. 7 is a partial view similar to FIG. 4 in the case of a ring-brush assembly using silver technology.

In both technologies, two brushes 10 or 10' at the ends of the arms of a V are in sliding contact with the same conducting ring 8 or 8'.

Because of the friction between the fixed and moving parts, wear occurs which, in silver technology (FIG. 7) is firstly manifested by wear of the brushes 10' and then by that of the conductive coating on the ring 8', while in gold technology (FIG. 4), the gold conductive layer on the ring 8 wears before the wiper-wire brushes 10.

In both cases, degradation of the sliding electrical contacts 11 and 11' is sudden at the end of life and may lead to a brush 10 or 10' breaking. In general, this break occurs after the wear but, however, an abnormal phenomenon associated, for example, with a fault in use (a short-circuit) may be unavoidable.

Figures 5, 6:
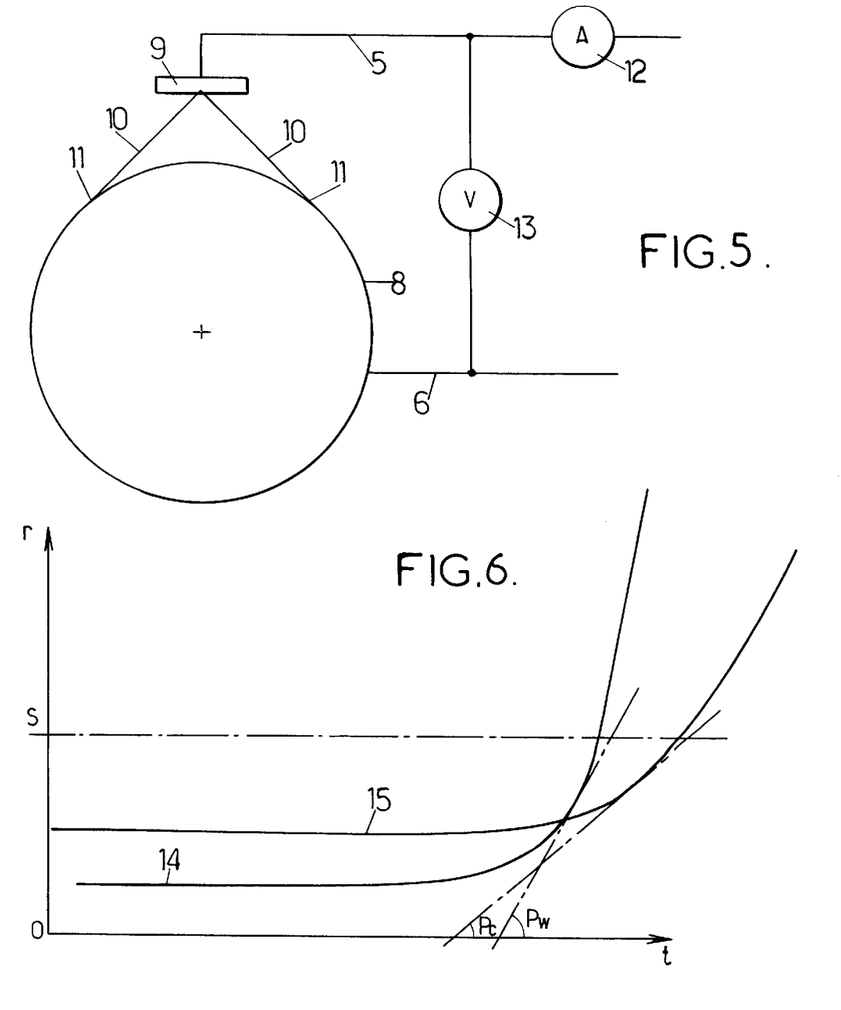

In order to appreciate the extent of this wear before it has serious consequences (failure of the commutator 4), the instantaneous value of the resistance of the sliding electrical contacts 11 or 11' between the ring 8 or 8' and the brushes 10 or 10' is measured using the circuit, shown in principle, in FIG. 5 and applied to a ring-brush assembly in gold technology (FIG. 4).

The current I flowing through the electrical contacts 11 between the ring 8 and the brush 10 is measured using an ammeter 12 on the electrical lead 5 connected to the brush holder 9 and the voltage V across the terminals of these sliding contacts 11 is measured using the voltmeter 13 connected between the electrical leads 5 and 6, thereby making it possible to determine the resistance r, this being equal to the ratio of the voltage V to the current I, i.e. r=V/I.

This measurement reveals variations in the resistance, called "electrical noise", and FIG. 6 depicts two curves showing that the value of this resistance increases with the cumulative period of operation of the commutators 4. Curve 14 shows the change, as a function of time (t) of the electrical resistance (r) of sliding contacts transferring power signals, while curve 15 is a similar curve for control signals. It may be observed that both curves 14 and 15 exhibit, after the start of the lifetime of the contacts, a substantially continuous increase in the resistance with a gentle slope, each curve then exhibiting a break, with a concavity facing upwards, leading to significant and rapid degradation towards the end of the lifetime of the contacts, the break being more pronounced and the slope of the increase in resistance being greater for power signals (curve 14).

By comparing the absolute value of an image signal of the resistance r of the sliding contacts with a threshold S, which may be different depending on the type of signal (power or measurement) or on the technology (gold or silver), as shown diagrammatically in FIG. 6, a signal is obtained which corresponds to the state of wear of these contacts when the threshold S is crossed, which threshold is, in this example, a constant resistance threshold used as a reference signal with which the image signal, which follows the variations in the measured resistance, is continuously compared. If it is desired to obtain a signal which reflects the change, that is to say the degradation in the wear of the sliding contacts, it is possible to compare variations in the value of the resistance at a slope threshold P which, optionally, may be a threshold Pw for power signals which differs from a threshold Pc for control signals. When the resistance exceeds the absolute value of the resistance threshold S, this means that the state of wear is critical, making maintenance work on the sliding contacts necessary and therefore enabling state-dependent maintenance to be carried out, while the change in the resistance with a slope greater than the slope threshold Pw or Pc gives a signal corresponding to the change in wear of the contacts, which corresponds to a critical degradation, enabling predictive maintenance to be carried out in anticipation of the electrical contacts breaking.

Furthermore, the variation in the electrical resistance (r), and therefore of its image signal, reflects not only the wear of the actual sliding contacts but also all the variations associated with vibrations, which are due, for example, to degradation of the rolling bearings and to the state of the surface of the rings 8 and 8'.

This resistance is constant for a given speed of rotation, that is to say that the average level of the measurement remains constant. In addition, the variations in the "electrical noise" as a function of the speed remain very small while the brushes and rings are in a good state, even for speeds varying from approximately 1 m/s to 2 m/s, which corresponds to speeds of rotation of about 300 rpm and 1500 rpm in the case of main and tail helicopter rotors, respectively.

In contrast, the resistance of the contact increases with speed almost exponentially with worn rings or brushes.

The "electrical noise" is also proportional to the current, in gold technology, and almost proportional to the current in silver technology but decreases with the number of brushes in contact with the same track.

According to FIG. 4, in either gold or silver technology, the amount of current transferred determines the contact surface of each brush 10, and the number of brushes 10 used in the same channel, with the same ring 8. As a result, it is easier to detect the "electrical noise" when there is a small number of brushes 10, for example a pair of brushes 10 arranged in a V configuration, as in FIG. 4, or two identical pairs in this V arrangement. For a greater number of pairs of brushes, the variations in the resistance are less able to be detected. This is because the individual resistances, at each sliding electrical contact 11, are in parallel and as each brush 10 reacts differently from the others, the result of the overall resistance becomes constant and low when the number of contacts 11 increases.

This means that a defect or a state of wear during the transfer of a power current cannot be detected immediately when there is a large number of electrical contacts 11.

Assuming that there are ten pairs of brushes 10 in V configuration in contact with the same ring 8 and if one of the twenty brushes 10 breaks, the increase in the resistance is 1/19, i.e. approximately 5%, that is to say in a range which is not detectable if it is taken that the variation in the "electrical noise" is 100% with respect to an average value, this increase in "electrical noise" being due to the increase in the current passing through all the other brushes 10.

However, the loss of the sliding contact 11 at a brush 10 is usually caused by wear of the gold coating on the commutator ring 8 rather than by the brush 10 breaking, due to the effect of vibrations, of stresses experienced or of a structural defect.

The increase in the resistance of the contact 11 at each brush 10 consequently improves the detectability of the defect. However, and still in the case of transfer of an electrical power signal, a relatively short time interval elapses between this detection of wear and total non-operation, that is to say failure of the commutator 4, since any current no longer passing through a contact 11, or passing through it less easily, must pass through the other contacts. Therefore, above a permissible individual power level, fusion occurs and therefore destruction of each brush 10. The time interval between detection of a fault in the contacts 11 and destruction of the brushes 10 and/or of the ring 8 is therefore inversely proportional to the number of contacts 11.

In order to quantify the values, a ratio exists which varies depending on the amperage and the technology employed, for example 10, between the initial characteristics of the electrical resistance of the contacts 11 and a critical resistance threshold, the causes of this threshold being exceeded possibly being not only wear but also contamination.

In contrast, degradation of the electrical contacts 11 during transfer of electrical control or measurement signals is more easily detectable when one or two pairs of brushes 10 in a V configuration against the same ring 8 are used. The electrical arrangement of the sliding contacts 7 of the commutator 4 may be that in FIG. 3a: the heating mat 3 is supplied with a power current I through a contact 7, the electrical return taking place via two contacts 7 in parallel, one of which sends a measurement signal via a line 5a. The voltage difference ΔV taken into account for detecting the wear of the measurement contact 7 is measured between the measurement line 5a and the output line of the other return contact 7.

These qualitative and quantitative differences in behaviour are well portrayed by the different forms of curves 14 and 15 in FIG. 6.

In silver technology (FIG. 7), the contact resistance is almost constant as a function of the speed, and increases approximately proportionally to the current. In this case, it should be noted that the "electrical noise" is rather less favourable to easy detection of wear when the current is low. In particular, at constant current, some readings corresponding to the tracking of the contact-resistance variations show a drop in voltage. In this case, since the sensitivity of the measurement is related to the current output, good detection results may be obtained when transferring large currents, while these results are poor for small currents.

In this technology, the resistance of a ring 8'-flat brush 10' pair is proportional to the current, and there are conventionally two brushes 10' sliding over the same ring 8', as shown in FIG. 7. However, it is possible to double or triple the number of brushes 10' in order to improve the electrical contact resistance, or even to increase the current, in order to take account of the limited size of the ring 8'. The contact between the silver coating on the ring 8' with a carbon-silver brush 10' is more sensitive to external agents, such as contamination, the presence of oil or of sulphur, than the electrical contact 11 in gold technology (see FIG. 4).

In silver technology (FIG. 7), the contact 11' between each flat brush 10' and the ring 8' degrades more frequently because the brush 10' is at the wear limit, as this brush wears before the ring 8', or because of contamination. The "electrical noise" always increases significantly when there is degradation, in a ratio which may be greater than 10 between the initial values of the resistance and these critical values, so that the increase in "electrical noise" is at least as rapid in silver technology as in gold technology, these two types of contacts being substantially the most appropriate to the detection principle.

This detection principle, according to which the observation of "electrical noise", the tracking of its change and its continuous comparison with at least one critical threshold, in terms of absolute value or in terms of slope, making it possible to define the moment to instigate carrying out maintenance on the basis of the threshold having been exceeded, may be applied, when using silver technology, with lower detection levels than those appropriate when using gold technology.

Figure 16A:
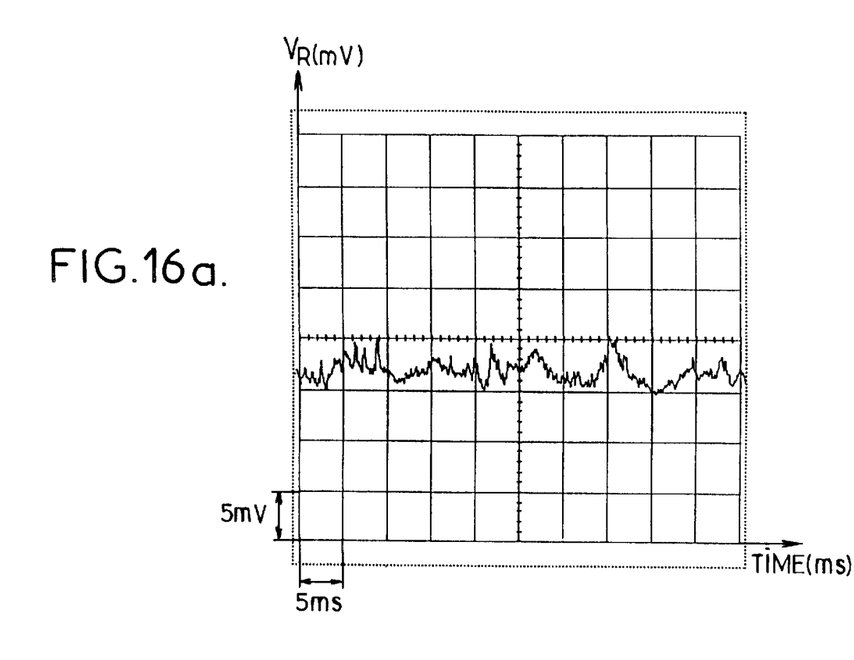
Figure 16B:
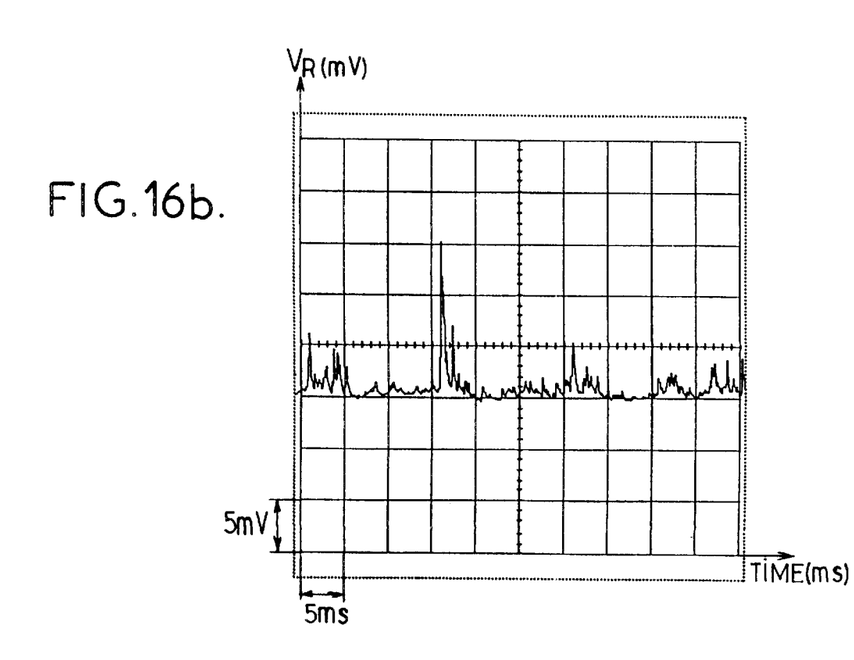
Figure 17A:
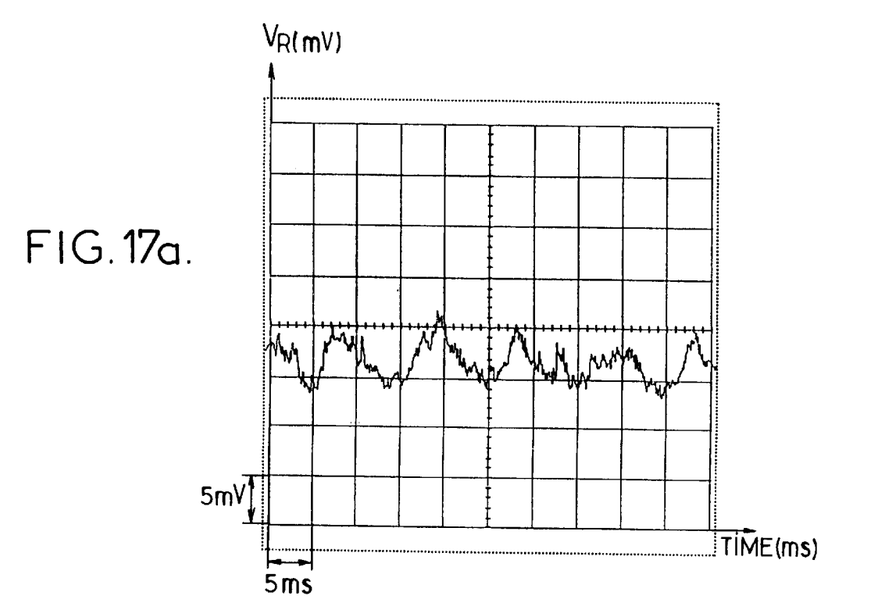
Figure 17B:
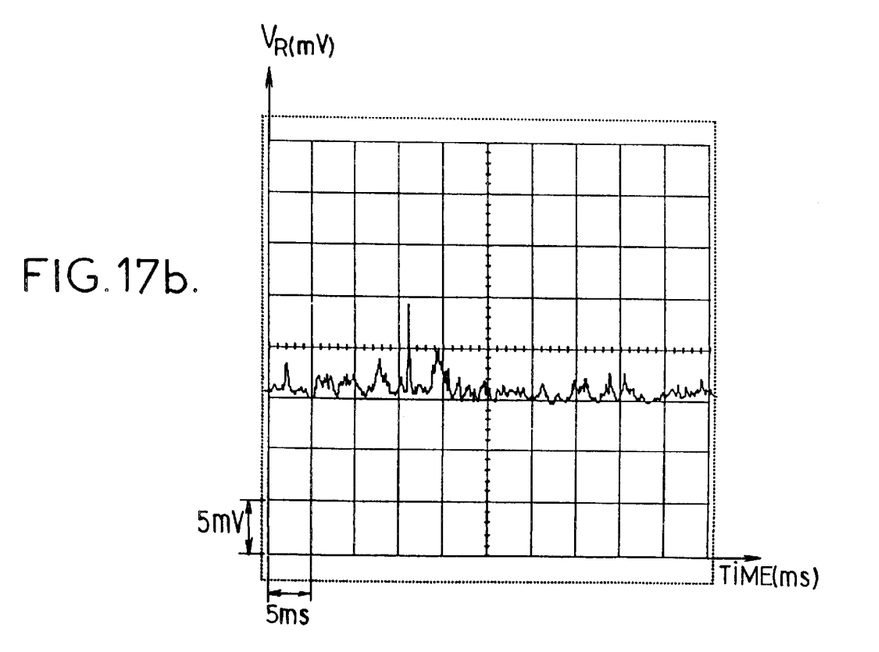
Figure 18A:
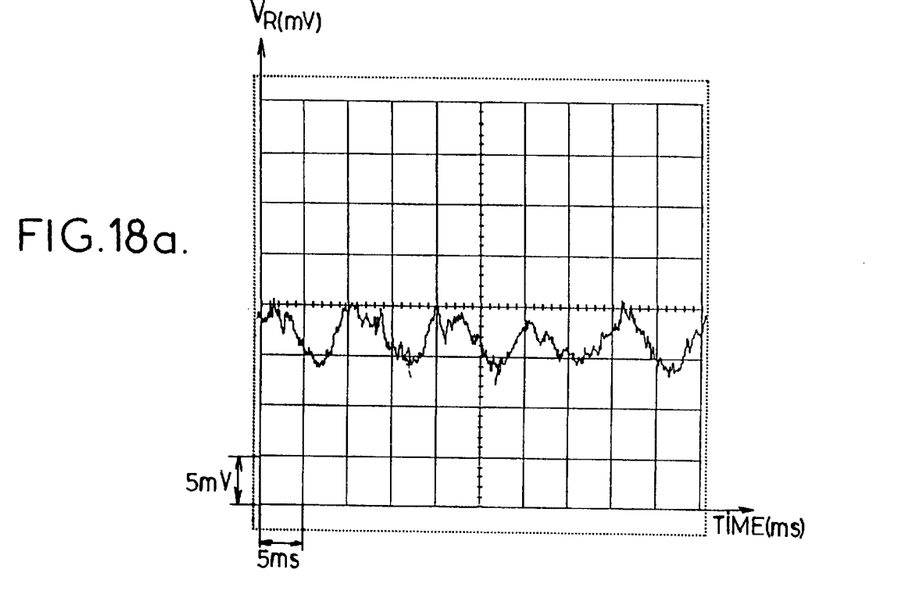
Figure 18B:
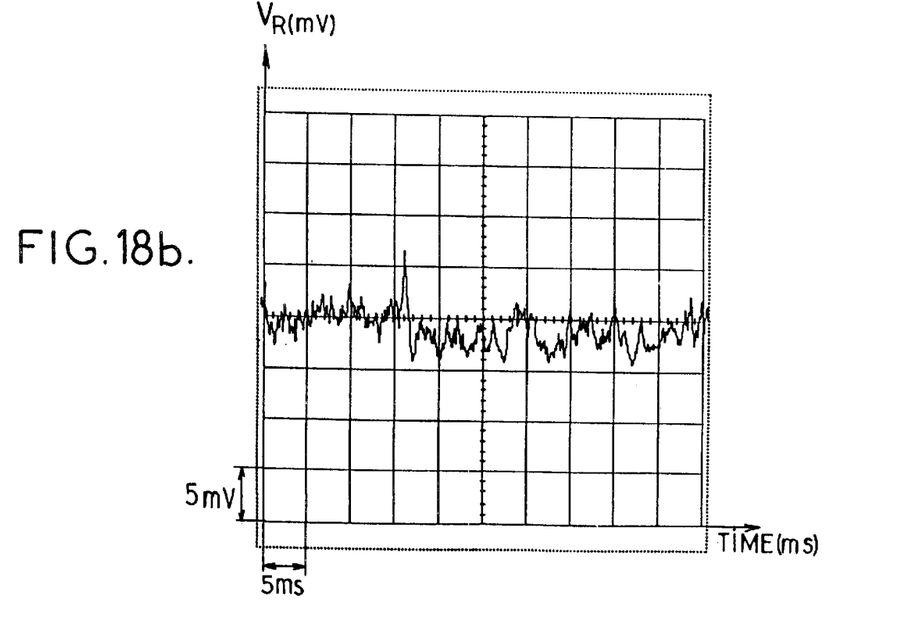

FIGS. 10a to 18b show "electrical noise" measurement oscillograms recorded in a few configurations representative of the sliding contacts for various values of the speed (1 m/s in the case of FIGS. 10a to 12b and 2 m/s in the case of FIGS. 13a to 18b), of the number of contacts or rather of pairs of contacts in V configuration, as in FIGS. 4 and 7 (one pair of contacts 11 as per FIG. 4 in the case of FIGS. 10*a*, 10*b*, 13*a*, 13*b*, two pairs as per FIG. 4 in the case of FIGS. 11*a*, 11*b*, 14*a*, 14*b* and ten pairs as per FIG. 4 in the case of FIGS. 12*a*, 12*b*, 15*a* and 15*b*) and also for the two technologies, gold and silver (FIGS. 10*a* to 15*b* in the case of gold technology, FIGS. 16*a* to 18*b* in the case of silver technology, with a speed of 2 m/s, FIGS. 16*a* and 16*b* in the case of a pair of flat brushes 10' as per FIG. 7, FIGS. 17*a* and 17*b* in the case of two pairs of brushes 10' and FIGS. 18*a* and 18*b* in the case of ten pairs of brushes 10' as per FIG. 7).

The measurements on a silver ring 8' correspond to small flat brushes 10' having a cross-section of 5 mm×2 mm.

The values derived through the measurement if corresponding image signal tensions using these oscillograms reflect the quantitative and qualitative variations in the resistance when the speed of rotation of the sliding contacts, the number of these contacts and their technology are varied.

Thus, all FIGS. 10 to 18 followed by the letter a correspond to oscillograms from contacts in good condition, while all FIGS. 10 to 18 followed by the letter b give the measurements (on different scales) from the respectively corresponding contacts in an advanced state of wear.

Figure 12A:
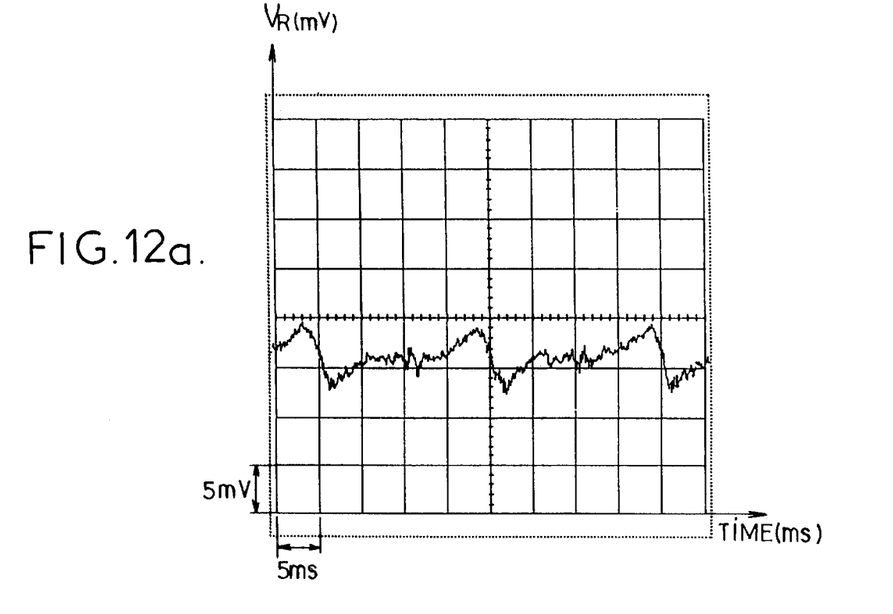
Figure 12B:
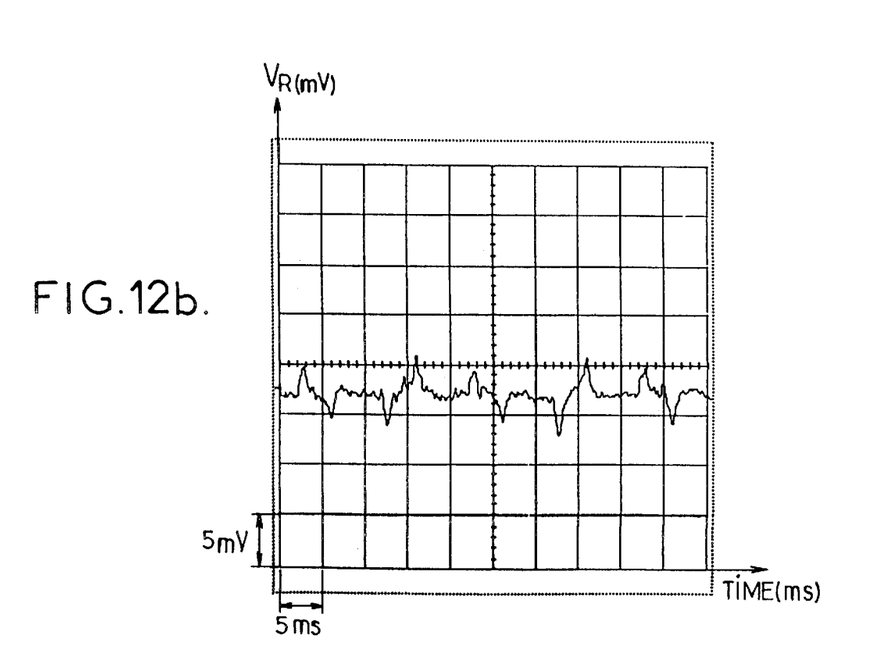
Figure 13A:
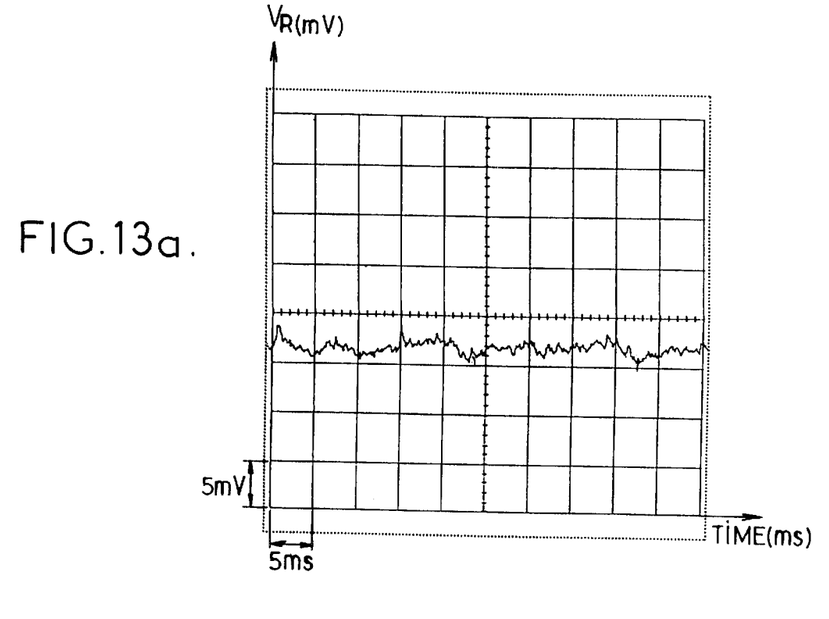
Figure 13B:
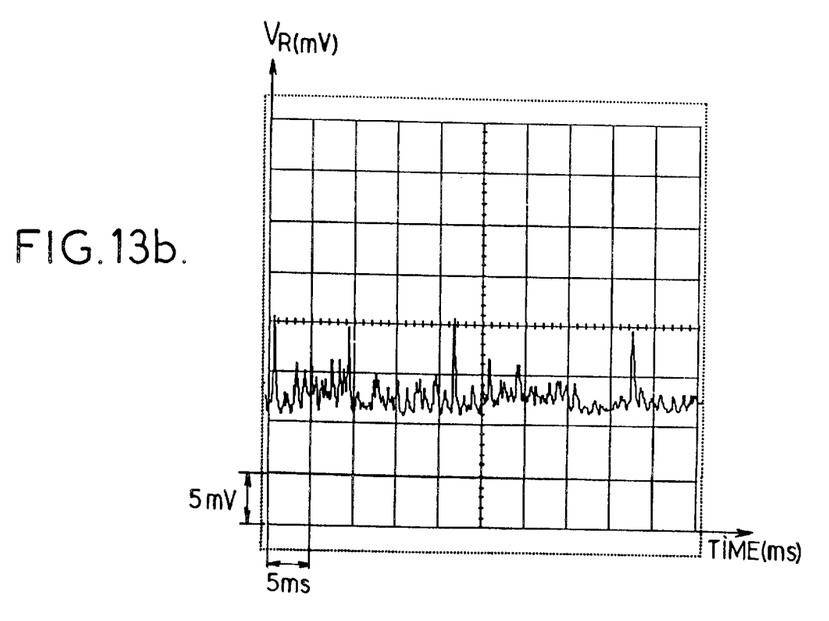
Figure 14A:
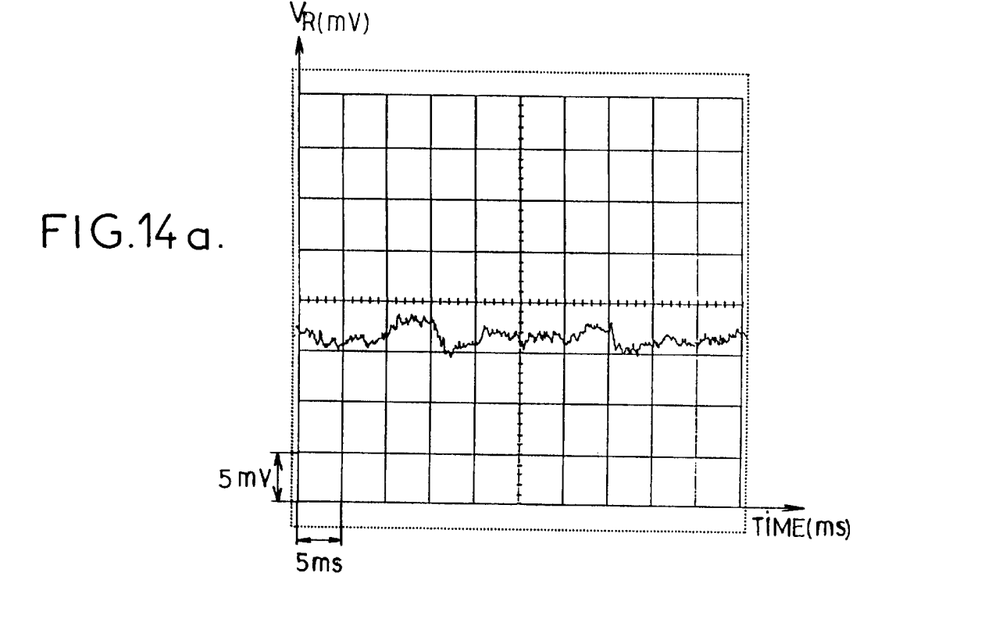
Figure 14B:
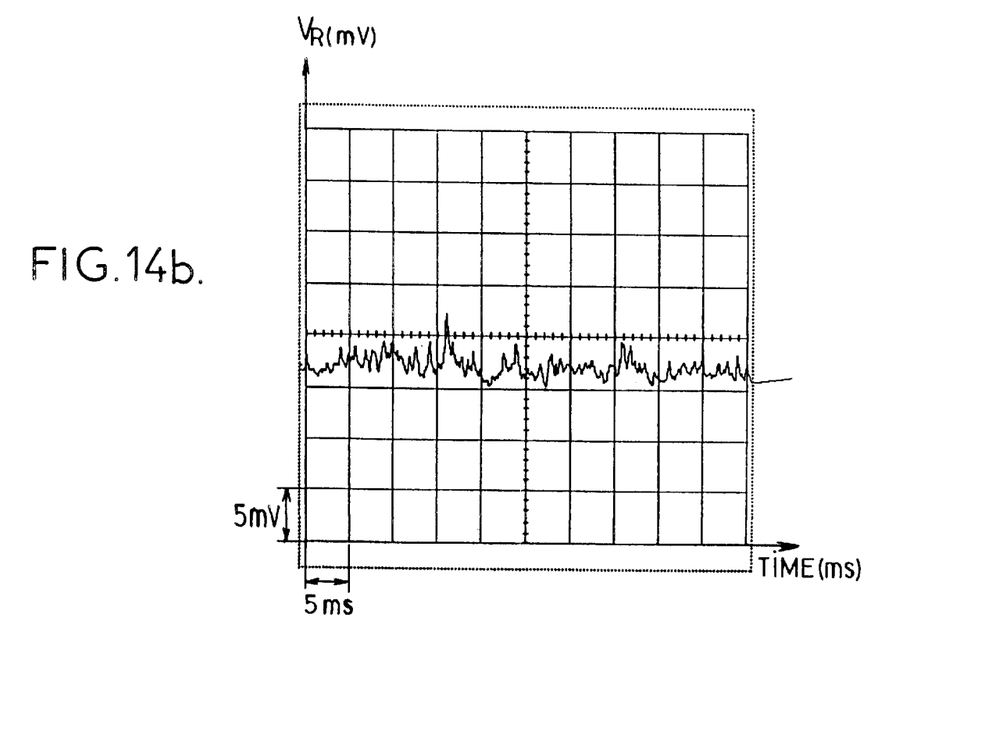
Figure 15A:
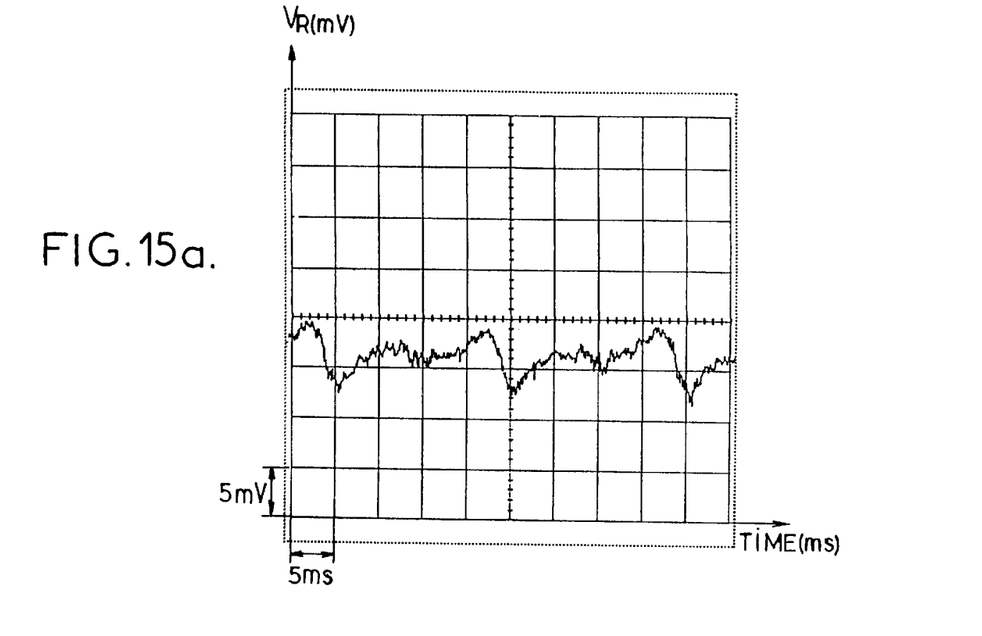
Figure 15B:
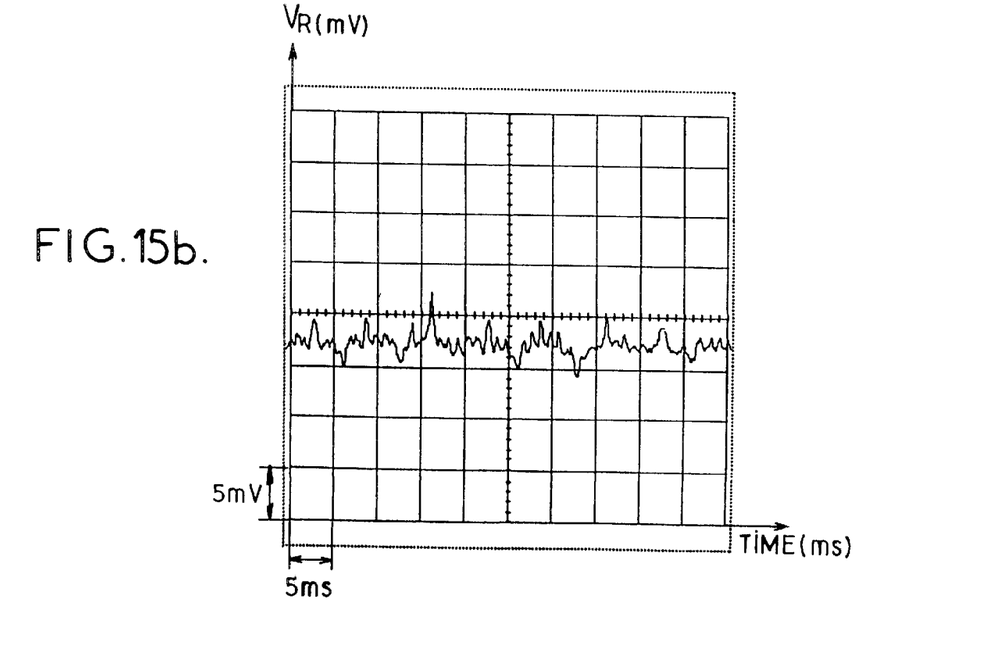

In gold technology, for a constant speed of 1 m/s and for contacts in good condition, the measured resistance goes from 5 mΩ for 1 pair of contacts (FIG. 10*a*) to 2 mΩ for 2 pairs of contacts (FIG. 11*a*) and 1.5 milliohm for 10 pairs of contacts (FIG. 12*a*). If the speed is 2 m/s, and for respectively the same numbers of pairs of contacts, values of 5 mΩ, 2 mΩ and 1.5 mΩ are derived from resistance corresponding to the measured image signal "V" (see FIGS. 13*a*, 14*a* and 15*a*). When the same pair or pairs of contacts is or are in a state of advanced wear, the resistance corresponding to the measured image signal "V" respectively goes from 60 mΩ, for a pair of contacts (FIG. 10*b*), to 25 mΩ for 2 pairs of contacts (FIG. 11*b*) and to 10 mΩ for 10 pairs of contacts (FIG. 12*b*) still at the same speed of 1 m/s. At 2 m/s, the resistance corresponding to the measured image signal "V" of degraded contacts goes from 200 mΩ (FIG. 13*b*) for 1 pair of contacts to 75 mΩ (FIG. 14*b*) for 2 pairs of contacts and to 15 mΩ (FIG. 15*b*) for 10 pairs of contacts.

In silver technology (FIG. 7) and for a speed of 2 m/s, the resistance corresponding to the measured image signal "V" for contacts in good condition goes from 5 mΩ (FIG. 16*a*) for 1 pair of contacts to 3 mΩ (FIG. 17*a*) for 2 pairs of contacts and to 2 mΩ (FIG. 18*a*) for 10 pairs of contacts, while for contacts in a poor condition, this resistance corresponding to the measured image signal "V", at this same speed of 2 m/s and for the corresponding numbers of pairs of contacts, goes from 300 mΩ (FIG. 16*b*) to 200 mΩ (FIG. 17*b*) and to 15 mΩ (FIG. 18*b*).

These oscillograms make it possible to state that the recordings of the values in the two technologies, gold and silver, are similar and also able to be used for the desired detection.

Figure 8:
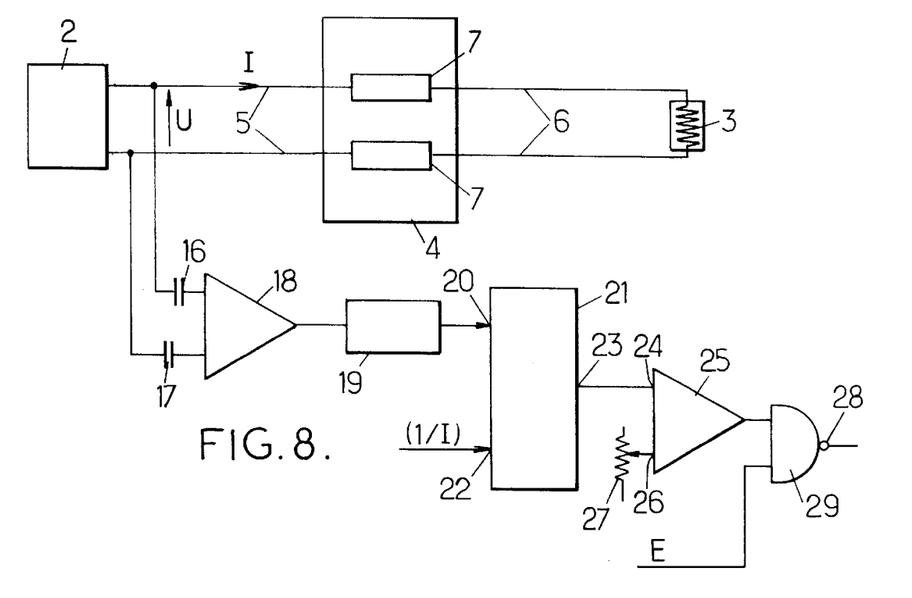
FIG. 8 is a diagram of a circuit for detecting the wear of the sliding contacts of the commutator in FIGS. 1 to 3.

On a helicopter, as in any other application, such detection may be carried out using a circuit according to FIG. 8.

This circuit again shows the supply unit 2, the commutator 4 and a heating mat 3 of FIG. 1, as well as the sets of sliding contacts 7 in the commutator 4, in the channel for supplying the heating mat 3 from the supply unit 2 and in the channel for the return from the mat 3 to the unit 2.

The supply unit 2 generates a voltage U (between the two, supply and return, conducting leads of the cable 5) and outputs a current I to the heating mat 3 via the supply and return channels of the commutator 4 via the sets of sliding contacts 7. The DC component of the voltage U is filtered by capacitors 16 and 17, upstream of the two inputs of an amplifier 18, so as to keep only the variations in voltage, these being amplified by the amplifier 18, then filtered by the filter 19 and applied to an input 20 of a multiplier 21.

An image voltage corresponding to the instantaneous voltage variations u is therefore obtained at the input 20, which image voltage is multiplied by an image voltage corresponding to the inverse of the current 1/I, the latter image voltage being delivered to the second input 22 of the multiplier 21. An image voltage corresponding to the resistance r=u/I is thus created at the output 23 of the multiplier unit 21, this resistance image signal being delivered to an input 24 of a threshold comparator 25, a second input 26 of which is connected in an adjustable manner to a potentiometer 27 for determining an adjustable threshold. At the output of the comparator 25, the result of this comparison between the image signal corresponding to the measured resistance and the adjustable resistance threshold is sent at 28 to the output of a logic gate 29 depending on the state of a pulsed sample signal E delivered to the second input of the logic gate 29, the first input of which receives the output from the comparator 25.

The "electrical noise" spectrum lies within the 0 to 10 kHz band, above which the noise level is very low. A very good image of the "electrical noise" may be obtained by filtering at 1 or 2 kHz using the filter 19.

In this detection circuit, the power is a function of the sample E and of the voltage U. In practice, in the case of the commutator 4 for the tail rotor in FIG. 3, the amount of current flowing varies in the ratio of the voltages (270 V/150 V) when the voltage is switched.

Rather then comparing the absolute value or variations, as a function of time, in the values of the resistance image signal with a wear threshold or with a slope threshold indicative of contact degradation, another approach consists in recording and averaging, optionally weight-average, observed image signals corresponding to prior measurements of the electrical resistance so as to construct, by a learning process, a reference signal. The change in the wear of the contacts during flight, with respect to the change in the wear of the contacts over their life, is then taken into account. This procedure makes it possible to determine the operational characteristics of the contacts and to refine the curve of the effective wear model, on a helicopter, as a function of the time which elapses.

The circuit in FIG. 8 enables the method of monitoring the wear of sliding electrical contacts 7 to be applied to state-dependent and/or predictive maintenance of the commutator 4 by employing this method to sliding electrical contacts mounted in electrical power or control or measurement channels of the installation, for example for de-icing, having the commutator 4 provided with these sliding contacts 7.

Figure 9:
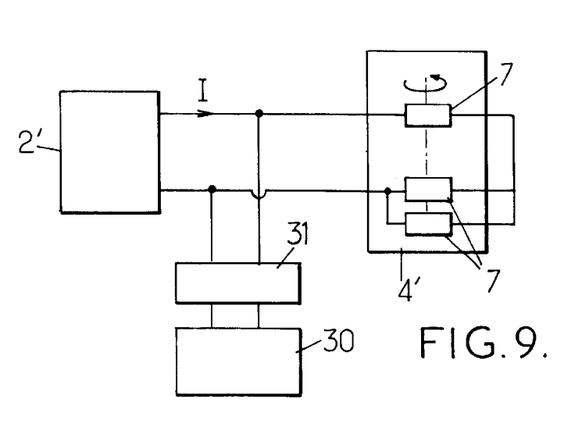
FIG. 9 is a diagram of another circuit for monitoring the wear of the sliding contacts in a rotating commutator having several sliding contacts in parallel on the return.
Figure 10A:
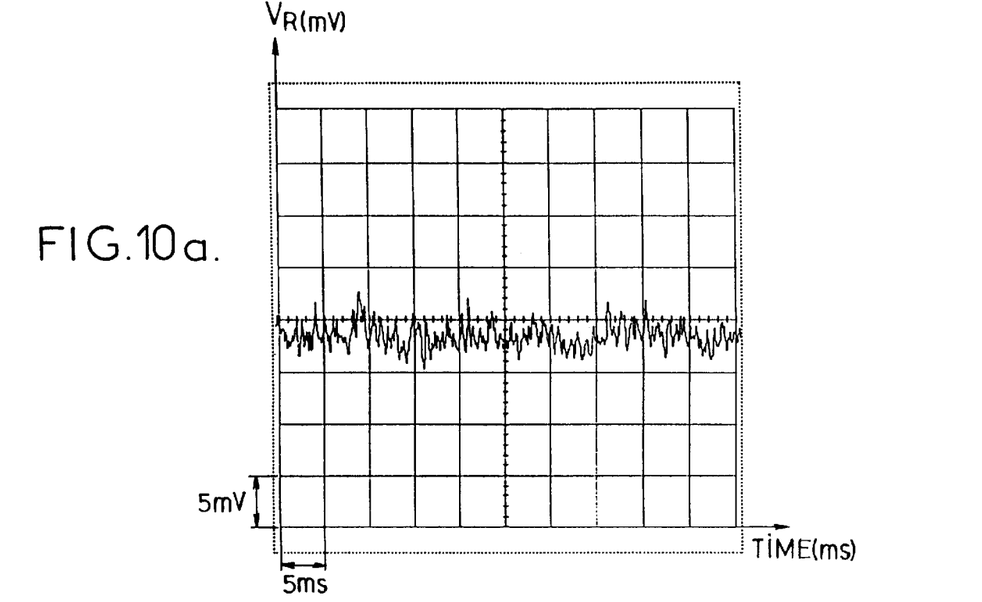
Figure 10B:
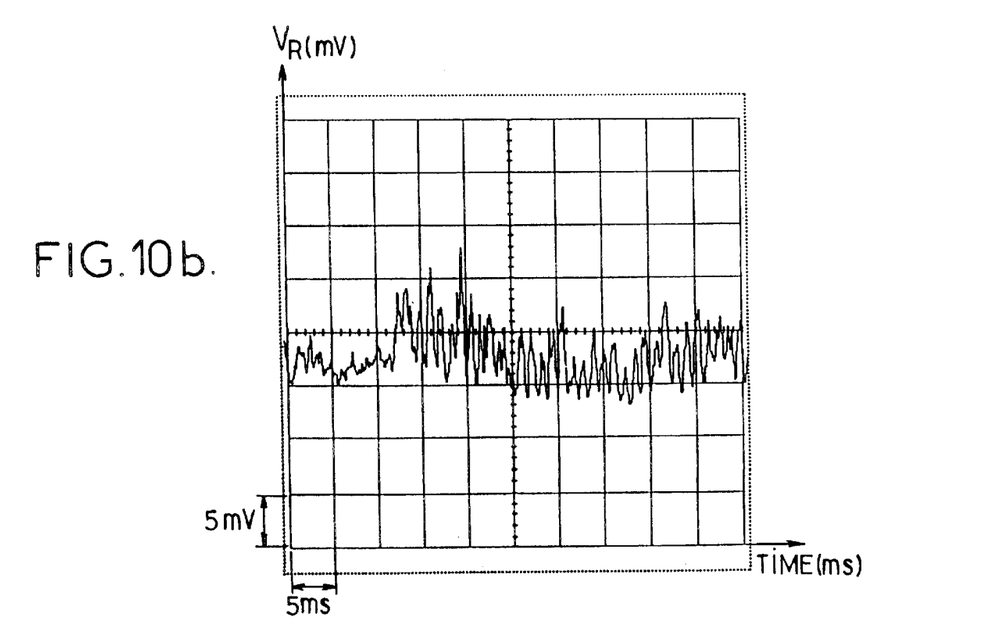
Figure 11A:
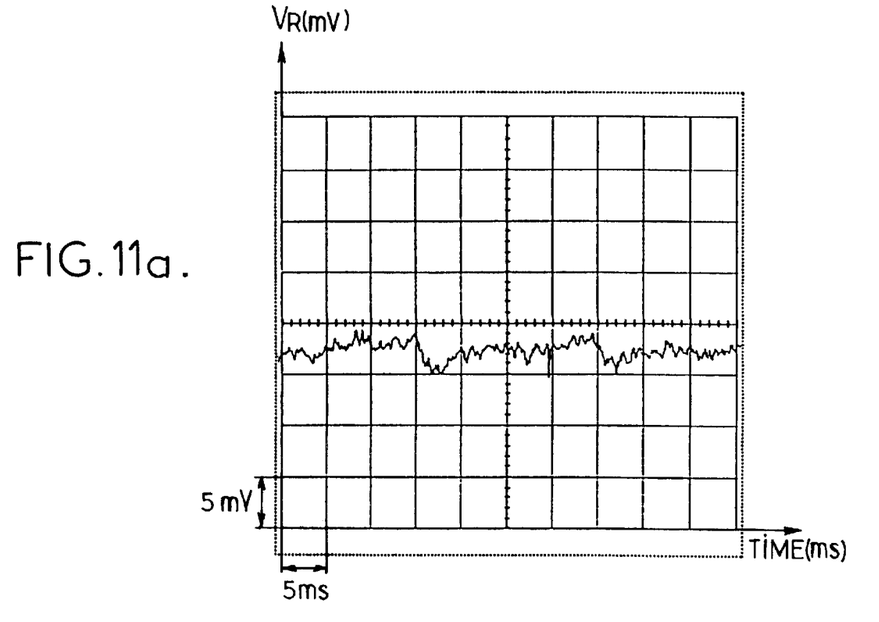
Figure 11B:
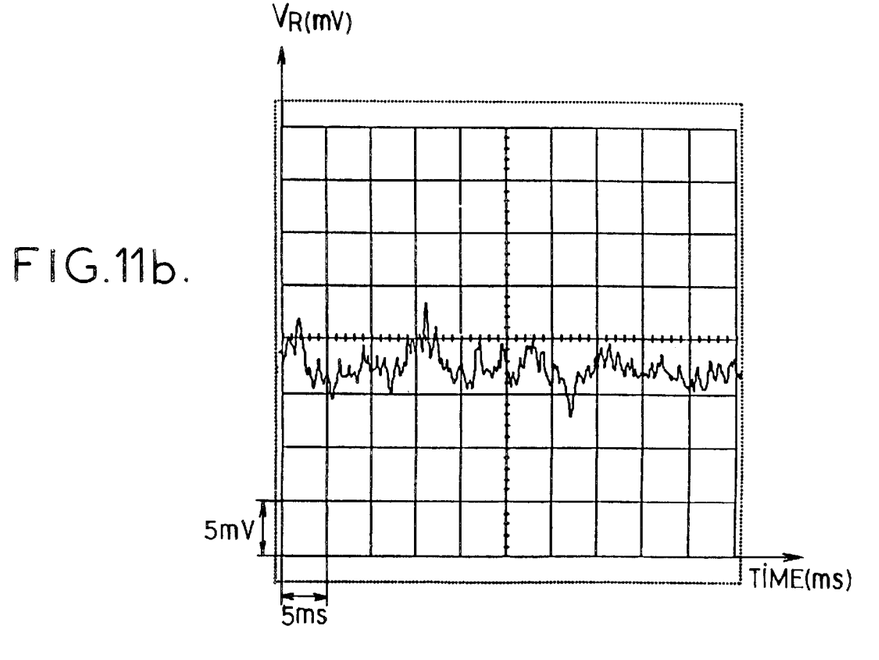

On the other hand, the arrangement in FIG. 9 makes it possible to employ this method of monitoring wear to dedicated electrical contacts mounted in an electrical channel dedicated to this monitoring.

In this arrangement, once again there is a power unit 2', which generates a constant current of, for example, 100 mA. This current is sent to a first set of sliding contacts 7, belonging to a rotating commutator 4', and is mounted in short-circuit with two other sets of sliding contacts 7 comprising rings mounted in parallel on the return back to the generator 2'. The current thus passes from the stator to the rotor via a single ring and returns from the rotor to the stator via the other two rings mounted in parallel. By making a constant current flow through the sliding contact or contacts associated with the input ring, the variations in voltage U are proportional to the variations in resistance r. An image of r is thus obtained directly, since r=kU, where k=1/I=a constant.

Using an oscilloscope 30 associated with means for recording the oscillograms, and through an amplifier 31 to the inputs of which the variations in voltage U are applied, it is possible to read and record the variations in the electrical resistance of the sliding contacts associated with the single input ring. However, even if the measurement is carried out simultaneously on two rings, one of which is for the input current and one for the output current, the result can be used, the only proviso being that it is not known whether the "electrical noise" detected comes more from one of the two rings or from the other. This is because the "electrical noise" signal is pseudo-random and does not necessarily appear at the same time on both rings of the commutator.

The aforementioned oscillograms reveal different apparent frequencies of the "electrical noise" depending on the technology of the contacts. This is because this apparent frequency is related to the speed of the rotating contacts, since all the phenomena associated with vibrations of the brushes are reproduced in turn. The apparent frequency is also related to the number of contacts and to their position around each ring. With reference to FIG. 4, this physical phenomenon corresponds to passage of the conducting lead 6 soldered to the ring 8 opposite the contact end of each brush 10. Apart from the "electrical noise" phenomenon of each contact 11, a resistance variation phenomenon occurs. The ring 8/brush 10 resistance corresponds in fact to the resistance between the electrical lead 6 soldered to the commutator ring 8 and the brush 10 itself. The length of the electrical conductor formed by this contact varies during rotation of the ring 8 depending on the position of the welded lead 6 with respect to the position of the brushes 10. Consequently, since the resistance is directly related to the length of the conductor consisting of the welded electrical lead 6 and the brushes 10, this resistance is a minimum when, during rotation of the ring 8, the lead 6 passes opposite the points of contact 11 closest to the brushes 10, while the resistance is a maximum when the lead 6 passes through the point furthest away from the brushes 10, i.e. at the middle of the major arc formed on the ring 8 between the two contacts 11, practically in the position in FIG. 4, and finally this resistance is intermediate when the electrical lead 6 passes through the mid-point of the minor arc delimited on the ring 8 between the two contacts 11.

The method and the device according to the invention, for detecting the wear of sliding contacts, thus make it possible to anticipate the breakage of contacts by monitoring their wear, through the tracking of the image signal corresponding to the electrical resistance of the contacts, the appearance of this signal, by comparison with one or more reference thresholds, making it possible to determine the state of wear of these contacts and to forecast when they will break, thereby allowing state-dependent and/or predictive maintenance, carried out using on-board diagnostic, monitoring and flight-management systems with which modern aeroplanes and helicopters are increasingly becoming equipped.

We claim:

1. Method of monitoring the wear of at least one sliding electrical contact of at least one electrically conducting brush, sliding over at least one electrically conducting track which can move with respect to the brush in relative rotational or linear motion, the method including the steps consisting in measuring the electrical resistance of said sliding contact, in delivering at least one image signal corresponding to the measured resistance, in tracking the variations of said image signal, in constructing at least one reference signal indicative of a state of wear of said sliding contact, in comparing said image signal with said reference signal and in deriving at least one signal corresponding to the state of wear of said sliding contact from said comparison of said image signal with said reference signal.

2. Method according to claim 1, wherein the step of measuring the electrical resistance (r) of said sliding contact comprises the measurement of electric current (I) flowing through said sliding contact, the measurement of voltage (V) across the terminals of said sliding contact and the determination of the electrical resistance using the calculation of the ratio (V/I).

3. Method according to claim 1, consisting in continuously carrying out the steps consisting in measuring the electrical resistance of said sliding contact, in delivering said image signal, in tracking the variations of said image signal and in comparing said image signal with said reference signal.

4. Method according to claim 1, wherein the comparison step comprises at least one comparison of the absolute value of said image signal with at least one reference signal, constructed in the form of a resistance threshold, indicative of a state of wear of said contact.

5. Method according to claim 1, wherein the comparison step comprises at least one comparison of the variations, over time, in the value of the image signal with at least one reference signal, constructed in the form of a resistance slope threshold, indicative of the change in the wear of said contact.

6. Method according to claim 1, wherein the comparison step comprises at least one comparison of said image signal with at least one reference signal constructed, by a learning process, in the form of a recording of prior image signals which are duly processed.

7. Device for monitoring the wear of at least one sliding electrical contact for implementing the method according to claim 1, said device comprising:

means for measuring the current flowing through said sliding contact, means for measuring the voltage across the terminals of said sliding contact, means for calculating the electrical resistance of said sliding contact and for constructing an image signal corresponding to said resistance, means for constructing at least one reference signal indicative of a state of wear of said sliding contact, means for comparing said image signal with said reference signal, and means for generating a signal corresponding to the state of wear of said sliding contact.

8. Method according to claim 1 said method including the step of delivering at least one signal corresponding to the state of wear of said contact and/or anticipating when said contact will break, upon said image signal, corresponding to its electrical resistance, crossing at least one threshold indicative of the wear of said contact.

9. Method according to claim 8, said method including the step of monitoring the wear of at least one sliding electrical contact is implemented on a dedicated contact mounted in an electrical channel dedicated to said monitoring.

10. Method according to claim 8, said method including the step of monitoring the wear of at least one contact is implemented on a contact mounted in an electrical power, control or measure channel of said device which includes said contact.

* * * * *